US008208322B2

(12) United States Patent
Gorobets

(10) Patent No.: US 8,208,322 B2
(45) Date of Patent: *Jun. 26, 2012

(54) NON-VOLATILE MEMORY CONTROL

(75) Inventor: Sergey Anatolievich Gorobets, Edinburgh (GB)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/108,477

(22) Filed: May 16, 2011

(65) Prior Publication Data

US 2011/0310683 A1    Dec. 22, 2011

Related U.S. Application Data

(63) Continuation of application No. 11/800,974, filed on May 8, 2007, now Pat. No. 7,944,762, which is a continuation of application No. 10/867,800, filed on Jun. 14, 2004, now Pat. No. 7,215,580, which is a continuation of application No. 10/260,074, filed on Sep. 27, 2002, now Pat. No. 6,751,155.

(30) Foreign Application Priority Data

Sep. 28, 2001 (GB) .................................. 0123416.0

(51) Int. Cl.
*G11C 7/00* (2006.01)
(52) U.S. Cl. .................. 365/194; 365/189.04; 365/239; 365/189.011
(58) Field of Classification Search .................. 365/194, 365/189.04, 189.011, 239
See application file for complete search history.

(56) References Cited

U.S. PATENT DOCUMENTS

| 4,099,069 | A | 7/1978 | Cricchi et al. |
| 4,130,900 | A | 12/1978 | Watanabe |
| 4,210,959 | A | 7/1980 | Wozniak |
| 4,309,627 | A | 1/1982 | Tabata |
| 4,355,376 | A | 10/1982 | Gould |
| 4,398,248 | A | 8/1983 | Hsia et al. |
| 4,405,952 | A | 9/1983 | Slakmon |
| 4,414,627 | A | 11/1983 | Nakamura |
| 4,450,559 | A | 5/1984 | Bond et al. |

(Continued)

FOREIGN PATENT DOCUMENTS

AU    0 557 723    1/1987

(Continued)

OTHER PUBLICATIONS

Kai Hwang & Faye A. Briggs, *Computer Architecture and Parallel Processing*, McGraw-Hill Book Co., 1984, p. 64.

(Continued)

*Primary Examiner* — Viet Q Nguyen
(74) *Attorney, Agent, or Firm* — Leffert Jay & Polglaze, P.A.

(57) ABSTRACT

Methods and apparatus for use in a memory system having a non-volatile memory and a controller for limiting the number of non-volatile memory arrays from a plurality of available arrays accessed at one time are useful in the control of concurrent access of memory arrays. One method includes implementing a pipelining sequence for transferring data to and from the non-volatile memory arrays and limiting the number of active arrays operating at one time. The controller is configured to wait for the at least one of the arrays to complete before initiating a transfer to and from a further array.

20 Claims, 9 Drawing Sheets

U.S. PATENT DOCUMENTS

| | | |
|---|---|---|
| 4,456,971 A | 6/1984 | Fukuda et al. |
| 4,468,730 A | 8/1984 | Dodd et al. |
| 4,473,878 A | 9/1984 | Zolnowsky et al. |
| 4,476,526 A | 10/1984 | Dodd |
| 4,498,146 A | 2/1985 | Martinez |
| 4,525,839 A | 6/1985 | Nozawa et al. |
| 4,532,590 A | 7/1985 | Wallach et al. |
| 4,609,833 A | 9/1986 | Guterman |
| 4,616,311 A | 10/1986 | Sato |
| 4,654,847 A | 3/1987 | Dutton |
| 4,710,871 A | 12/1987 | Belknap et al. |
| 4,746,998 A | 5/1988 | Robinson et al. |
| 4,748,320 A | 5/1988 | Yorimoto et al. |
| 4,757,474 A | 7/1988 | Fukushi et al. |
| 4,774,700 A | 9/1988 | Satoh et al. |
| 4,780,855 A | 10/1988 | Iida et al. |
| 4,788,665 A | 11/1988 | Fukuda et al. |
| 4,797,543 A | 1/1989 | Watanabe |
| 4,800,520 A | 1/1989 | Iijima |
| 4,829,169 A | 5/1989 | Watanabe |
| 4,843,224 A | 6/1989 | Ohta et al. |
| 4,896,262 A | 1/1990 | Wayama et al. |
| 4,914,529 A | 4/1990 | Bonke |
| 4,920,518 A | 4/1990 | Nakamura et al. |
| 4,924,331 A | 5/1990 | Robinson et al. |
| 4,943,745 A | 7/1990 | Watanabe et al. |
| 4,953,122 A | 8/1990 | Williams |
| 4,970,642 A | 11/1990 | Yamamura |
| 4,970,727 A | 11/1990 | Miyawaki et al. |
| 5,070,474 A | 12/1991 | Tuma et al. |
| 5,093,785 A | 3/1992 | Iijima |
| 5,168,465 A | 12/1992 | Harari |
| 5,198,380 A | 3/1993 | Harari |
| 5,200,959 A | 4/1993 | Gross et al. |
| 5,218,695 A | 6/1993 | Noveck et al. |
| 5,220,518 A | 6/1993 | Haq |
| 5,226,168 A | 7/1993 | Kobayashi et al. |
| 5,227,714 A | 7/1993 | Lou |
| 5,253,351 A | 10/1993 | Yamamoto et al. |
| 5,267,218 A | 11/1993 | Elbert |
| 5,268,318 A | 12/1993 | Harari |
| 5,268,870 A | 12/1993 | Harari |
| 5,270,979 A | 12/1993 | Harari et al. |
| 5,293,560 A | 3/1994 | Harari |
| 5,297,148 A | 3/1994 | Harari et al. |
| 5,303,198 A | 4/1994 | Adachi et al. |
| 5,305,276 A | 4/1994 | Uenoyama |
| 5,305,278 A | 4/1994 | Inoue |
| 5,315,541 A | 5/1994 | Harari et al. |
| 5,315,558 A | 5/1994 | Hag |
| 5,329,491 A | 7/1994 | Brown et al. |
| 5,337,275 A | 8/1994 | Garner |
| 5,341,330 A | 8/1994 | Wells et al. |
| 5,341,339 A | 8/1994 | Wells |
| 5,341,341 A | 8/1994 | Fukuzo |
| 5,353,256 A | 10/1994 | Fandrich et al. |
| 5,357,475 A | 10/1994 | Hasbun et al. |
| 5,359,569 A | 10/1994 | Fujita et al. |
| 5,365,127 A | 11/1994 | Manley |
| 5,369,615 A | 11/1994 | Harari et al. |
| 5,371,702 A | 12/1994 | Nakai et al. |
| 5,381,539 A | 1/1995 | Yanai et al. |
| 5,382,839 A | 1/1995 | Shinohara |
| 5,384,743 A | 1/1995 | Rouy |
| 5,384,745 A | 1/1995 | Konishi et al. |
| 5,388,083 A | 2/1995 | Assar et al. |
| 5,396,468 A | 3/1995 | Harari et al. |
| 5,404,485 A | 4/1995 | Ban |
| 5,406,527 A | 4/1995 | Honma |
| 5,418,752 A | 5/1995 | Harari et al. |
| 5,422,842 A | 6/1995 | Cernea et al. |
| 5,422,856 A | 6/1995 | Sasaki et al. |
| 5,428,621 A | 6/1995 | Mehrotra et al. |
| 5,430,682 A | 7/1995 | Ishikawa et al. |
| 5,430,859 A | 7/1995 | Norman et al. |
| 5,431,330 A | 7/1995 | Wieres |
| 5,434,825 A | 7/1995 | Harari |
| 5,438,573 A | 8/1995 | Mangan et al. |
| 5,465,235 A | 11/1995 | Miyamoto |
| 5,465,338 A | 11/1995 | Clay |
| 5,471,478 A | 11/1995 | Mangan et al. |
| 5,473,765 A | 12/1995 | Gibbons et al. |
| 5,479,638 A | 12/1995 | Assar et al. |
| 5,485,595 A | 1/1996 | Assar et al. |
| 5,490,117 A | 2/1996 | Oda et al. |
| 5,495,442 A | 2/1996 | Cernea et al. |
| 5,504,760 A | 4/1996 | Harari et al. |
| 5,508,971 A | 4/1996 | Cernea et al. |
| 5,513,138 A | 4/1996 | Manabe et al. |
| 5,515,333 A | 5/1996 | Fujita et al. |
| 5,519,847 A | 5/1996 | Fandrich et al. |
| 5,523,980 A | 6/1996 | Sakui et al. |
| 5,524,230 A | 6/1996 | Sakaue et al. |
| 5,530,673 A | 6/1996 | Tobita et al. |
| 5,530,828 A | 6/1996 | Kaki et al. |
| 5,530,938 A | 6/1996 | Akasaka et al. |
| 5,532,962 A | 7/1996 | Auclair et al. |
| 5,532,964 A | 7/1996 | Cernea et al. |
| 5,534,456 A | 7/1996 | Yuan et al. |
| 5,535,328 A | 7/1996 | Harari et al. |
| 5,541,551 A | 7/1996 | Brehner et al. |
| 5,544,118 A | 8/1996 | Harari |
| 5,544,356 A | 8/1996 | Robinson et al. |
| 5,552,698 A | 9/1996 | Tai et al. |
| 5,554,553 A | 9/1996 | Harari |
| 5,563,825 A | 10/1996 | Cernea et al. |
| 5,566,314 A | 10/1996 | DeMarco et al. |
| 5,568,439 A | 10/1996 | Harari |
| 5,572,466 A | 11/1996 | Sukegawa |
| 5,572,482 A | 11/1996 | Hoshizaki et al. |
| 5,579,502 A | 11/1996 | Konishi et al. |
| 5,581,723 A | 12/1996 | Hasbun et al. |
| 5,583,812 A | 12/1996 | Harari |
| 5,592,415 A | 1/1997 | Kato et al. |
| 5,592,420 A | 1/1997 | Cernea et al. |
| 5,594,704 A * | 1/1997 | Konishi et al. ........... 365/233.15 |
| 5,596,526 A | 1/1997 | Assar et al. |
| 5,598,370 A | 1/1997 | Niijima et al. |
| 5,602,987 A | 2/1997 | Harari et al. |
| 5,603,001 A | 2/1997 | Sukegawa et al. |
| 5,606,660 A | 2/1997 | Estakhri et al. |
| 5,611,067 A | 3/1997 | Okamoto et al. |
| 5,640,528 A | 6/1997 | Harney et al. |
| 5,642,312 A | 6/1997 | Harari |
| 5,648,929 A | 7/1997 | Miyamoto |
| 5,663,901 A | 9/1997 | Wallace et al. |
| 5,693,570 A | 12/1997 | Cernea et al. |
| 5,712,819 A | 1/1998 | Harari |
| 5,719,808 A | 2/1998 | Harari et al. |
| 5,723,990 A | 3/1998 | Roohparvar |
| 5,724,592 A | 3/1998 | Garner |
| 5,734,567 A | 3/1998 | Griffiths et al. |
| 5,745,418 A | 4/1998 | Ma et al. |
| 5,754,567 A | 5/1998 | Norman |
| 5,757,712 A | 5/1998 | Nagel et al. |
| 5,758,100 A | 5/1998 | Odisho |
| 5,761,117 A | 6/1998 | Uchino et al. |
| 5,768,190 A | 6/1998 | Tanaka et al. |
| 5,768,195 A | 6/1998 | Nakamura et al. |
| 5,773,901 A | 6/1998 | Kantner |
| 5,778,418 A | 7/1998 | Auclair et al. |
| 5,781,478 A | 7/1998 | Takeuchi et al. |
| 5,787,445 A | 7/1998 | Daberko |
| 5,787,484 A | 7/1998 | Norman |
| RE35,881 E | 8/1998 | Barrett et al. |
| 5,799,168 A | 8/1998 | Ban |
| 5,802,551 A | 9/1998 | Komatsu et al. |
| 5,805,513 A | 9/1998 | Takahashi et al. |
| 5,809,515 A | 9/1998 | Kaki et al. |
| 5,809,558 A | 9/1998 | Matthews et al. |
| 5,809,560 A | 9/1998 | Schneider |
| 5,818,350 A | 10/1998 | Estakhri et al. |
| 5,818,781 A | 10/1998 | Estakhri et al. |
| 5,822,245 A | 10/1998 | Gupta et al. |
| 5,822,252 A | 10/1998 | Lee et al. |
| 5,822,781 A | 10/1998 | Wells et al. |
| 5,831,929 A | 11/1998 | Manning |

| | | | |
|---|---|---|---|
| 5,835,935 A | 11/1998 | Estakhri et al. | |
| 5,838,614 A | 11/1998 | Estakhri et al. | |
| 5,845,313 A | 12/1998 | Estakhri et al. | |
| 5,847,552 A | 12/1998 | Brown | |
| 5,860,083 A | 1/1999 | Sukegawa | |
| 5,860,124 A | 1/1999 | Matthews et al. | |
| 5,862,099 A | 1/1999 | Gannage et al. | |
| 5,890,192 A | 3/1999 | Lee et al. | |
| 5,892,729 A | 4/1999 | Holder, Jr. | |
| 5,901,086 A | 5/1999 | Wang et al. | |
| 5,907,856 A | 5/1999 | Estakhri et al. | |
| 5,909,586 A | 6/1999 | Anderson | |
| 5,920,884 A | 7/1999 | Jennings, III et al. | |
| 5,924,113 A | 7/1999 | Estakhri et al. | |
| 5,928,370 A | 7/1999 | Asnaashari | |
| 5,930,815 A | 7/1999 | Estakhri et al. | |
| 5,933,368 A | 8/1999 | Ma et al. | |
| 5,933,846 A | 8/1999 | Endo | |
| 5,936,971 A | 8/1999 | Harari et al. | |
| 5,937,425 A | 8/1999 | Ban | |
| 5,953,737 A | 9/1999 | Estakhri et al. | |
| 5,956,473 A | 9/1999 | Ma et al. | |
| 5,959,926 A | 9/1999 | Jones et al. | |
| 5,966,727 A | 10/1999 | Nishino | |
| 5,986,933 A | 11/1999 | Takeuchi et al. | |
| 5,986,969 A | 11/1999 | Holder, Jr. | |
| 5,987,563 A | 11/1999 | Itoh et al. | |
| 5,987,573 A | 11/1999 | Hiraka | |
| 5,991,849 A | 11/1999 | Yamada et al. | |
| 5,995,731 A | 11/1999 | Crouch et al. | |
| 6,011,322 A | 1/2000 | Stumfall et al. | |
| 6,011,323 A | 1/2000 | Camp | |
| 6,018,265 A | 1/2000 | Keshtbod | |
| 6,021,408 A | 2/2000 | Ledain et al. | |
| 6,026,020 A | 2/2000 | Matsubara et al. | |
| 6,026,027 A | 2/2000 | Terrell, II et al. | |
| 6,034,897 A | 3/2000 | Estakhri et al. | |
| 6,035,357 A | 3/2000 | Sakaki | |
| 6,040,997 A | 3/2000 | Estakhri | |
| 6,047,352 A | 4/2000 | Lakhani et al. | |
| 6,055,184 A | 4/2000 | Acharya et al. | |
| 6,055,188 A | 4/2000 | Takeuchi et al. | |
| 6,069,827 A | 5/2000 | Sinclair | |
| 6,072,796 A | 6/2000 | Christensen et al. | |
| 6,076,137 A | 6/2000 | Asnaashari | |
| 6,081,447 A | 6/2000 | Lofgren et al. | |
| 6,081,878 A | 6/2000 | Estakhri et al. | |
| 6,084,483 A | 7/2000 | Keshtbod | |
| 6,094,693 A | 7/2000 | Haneda | |
| 6,097,666 A | 8/2000 | Sakui et al. | |
| 6,101,146 A * | 8/2000 | Maesako et al. | 365/230.03 |
| 6,115,785 A | 9/2000 | Estakhri et al. | |
| 6,122,195 A | 9/2000 | Estakhri et al. | |
| 6,125,424 A | 9/2000 | Komatsu et al. | |
| 6,125,435 A | 9/2000 | Estakhri et al. | |
| 6,128,695 A | 10/2000 | Estakhri et al. | |
| 6,134,145 A | 10/2000 | Wong | |
| 6,134,151 A | 10/2000 | Estakhri et al. | |
| 6,141,249 A | 10/2000 | Estakhri et al. | |
| 6,145,051 A | 11/2000 | Estakhri et al. | |
| 6,151,247 A | 11/2000 | Estakhri et al. | |
| 6,172,906 B1 | 1/2001 | Estakhri et al. | |
| 6,173,362 B1 | 1/2001 | Yoda | |
| 6,181,118 B1 | 1/2001 | Meehan et al. | |
| 6,182,162 B1 | 1/2001 | Estakhri et al. | |
| 6,191,974 B1 * | 2/2001 | Nishida et al. | 365/185.11 |
| 6,202,138 B1 | 3/2001 | Estakhri et al. | |
| 6,223,308 B1 | 4/2001 | Estakhri et al. | |
| 6,226,708 B1 | 5/2001 | McGoldrick et al. | |
| 6,230,234 B1 | 5/2001 | Estakhri et al. | |
| 6,262,918 B1 | 7/2001 | Estakhri et al. | |
| 6,272,610 B1 | 8/2001 | Katayama et al. | |
| 6,275,436 B1 | 8/2001 | Tobita et al. | |
| 6,279,069 B1 | 8/2001 | Robinson et al. | |
| 6,279,114 B1 | 8/2001 | Toombs et al. | |
| 6,285,607 B1 | 9/2001 | Sinclair | |
| 6,314,042 B1 * | 11/2001 | Tomishima et al. | 365/230.03 |
| 6,327,639 B1 | 12/2001 | Asnaashari | |
| 6,345,000 B1 * | 2/2002 | Wong et al. | 365/185.29 |
| 6,345,367 B1 | 2/2002 | Sinclair | |
| 6,370,628 B2 | 4/2002 | Beppu | |
| 6,374,337 B1 | 4/2002 | Estakhri | |
| 6,377,501 B2 * | 4/2002 | Maesako et al. | 365/230.03 |
| 6,393,513 B2 | 5/2002 | Estakhri et al. | |
| 6,397,314 B1 | 5/2002 | Estakhri et al. | |
| 6,411,546 B1 | 6/2002 | Estakhri et al. | |
| 6,467,021 B1 | 10/2002 | Sinclair | |
| 6,490,649 B2 | 12/2002 | Sinclair | |
| 6,567,307 B1 | 5/2003 | Estakhri | |
| 6,578,127 B1 | 6/2003 | Sinclair | |
| 6,584,034 B1 * | 6/2003 | Hsu et al. | 365/230.05 |
| 6,587,382 B1 | 7/2003 | Estakhri et al. | |
| 6,711,059 B2 | 3/2004 | Sinclair et al. | |
| 6,725,321 B1 | 4/2004 | Sinclair et al. | |
| 6,728,851 B1 | 4/2004 | Estakhri et al. | |
| 6,732,203 B2 | 5/2004 | Kanapathippillai et al. | |
| 6,735,106 B2 * | 5/2004 | Rickes et al. | 365/145 |
| 6,751,034 B1 | 6/2004 | Bloodworth et al. | |
| 6,751,155 B2 * | 6/2004 | Gorobets | 365/230.09 |
| 6,757,800 B1 | 6/2004 | Estakhri et al. | |
| 6,785,185 B2 | 8/2004 | Sumitani et al. | |
| 6,813,678 B1 | 11/2004 | Sinclair et al. | |
| 6,898,662 B2 | 5/2005 | Gorobets | |
| 6,912,618 B2 | 6/2005 | Estakhri et al. | |
| 6,950,918 B1 | 9/2005 | Estakhri | |
| 6,957,295 B1 | 10/2005 | Estakhri | |
| 6,973,519 B1 | 12/2005 | Estakhri et al. | |
| 6,978,342 B1 | 12/2005 | Estakhri et al. | |
| 7,000,064 B2 | 2/2006 | Payne et al. | |
| 7,006,404 B1 | 2/2006 | Manapat et al. | |
| 7,114,034 B2 | 9/2006 | Hu et al. | |
| 7,139,182 B2 | 11/2006 | Radke | |
| 7,215,580 B2 * | 5/2007 | Gorobets | 365/189.02 |
| 7,289,354 B2 | 10/2007 | Houston | |
| 7,944,762 B2 * | 5/2011 | Gorobets | 365/194 |
| 2001/0049767 A1 | 12/2001 | Park et al. | |
| 2003/0033471 A1 | 2/2003 | Lin et al. | |

FOREIGN PATENT DOCUMENTS

| | | |
|---|---|---|
| EP | 0 220 718 A2 | 5/1987 |
| EP | 0 243 503 A1 | 11/1987 |
| EP | 0 392 895 A2 | 10/1990 |
| EP | 0 424 191 A2 | 4/1991 |
| EP | 0 489 204 A1 | 6/1992 |
| EP | 0 522 780 A2 | 1/1993 |
| EP | 0 522 780 B1 | 1/1993 |
| EP | 0 544 252 A2 | 6/1993 |
| EP | 0 613 151 A2 | 8/1994 |
| EP | 0 617 363 A2 | 9/1994 |
| EP | 0 619 541 A2 | 10/1994 |
| EP | 0 663 636 A1 | 7/1995 |
| EP | 0 686 976 A2 | 12/1995 |
| EP | 0 897 579 B1 | 7/2000 |
| EP | 0 891 580 B1 | 11/2000 |
| EP | 0 896 669 B1 | 11/2000 |
| EP | 0 852 766 B1 | 5/2001 |
| EP | 0 852 765 B1 | 9/2001 |
| EP | 0 722 585 B1 | 5/2002 |
| EP | 0 910 826 B1 | 6/2002 |
| EP | 0 691 008 B1 | 11/2002 |
| EP | 0 861 468 B1 | 4/2003 |
| EP | 0 978 040 B1 | 5/2004 |
| EP | 1 157 328 B1 | 5/2005 |
| FR | 93 01908 | 8/1993 |
| GB | 2 251 323 | 7/1992 |
| GB | 2 291 990 | 2/1996 |
| GB | 2 291 991 | 2/1996 |
| GB | 2 297 637 | 7/1996 |
| GB | 2 304 428 | 3/1997 |
| GB | 2 348 991 | 12/2002 |
| GB | 2 351 822 | 1/2003 |
| GB | 2 384 337 | 7/2003 |
| GB | 2 384 883 | 10/2005 |
| GB | 2 384 338 | 11/2005 |
| GB | 2 384 072 | 12/2005 |
| GB | 2 411 499 | 2/2006 |
| IS | 117881 | 5/2003 |
| JP | 59-45695 | 9/1982 |

| | | |
|---|---|---|
| JP | 58-21594 | 12/1983 |
| JP | 58-21595 | 12/1983 |
| JP | 59-162695 | 9/1984 |
| JP | 60-212900 | 10/1985 |
| JP | 61-96598 | 5/1986 |
| JP | 62-283496 | 12/1987 |
| JP | 62-283497 | 12/1987 |
| JP | 63-183700 | 7/1988 |
| JP | 1-138694 | 5/1989 |
| JP | 3-228377 | 10/1991 |
| JP | 4-57295 | 2/1992 |
| JP | 4-254994 | 9/1992 |
| JP | 4-268284 | 9/1992 |
| JP | 4-278297 | 10/1992 |
| JP | 4-332999 | 11/1992 |
| JP | 5-128877 | 5/1993 |
| JP | 5-282883 | 10/1993 |
| JP | 6-36578 | 2/1994 |
| JP | 6-124175 | 5/1994 |
| JP | 6-124231 | 5/1994 |
| JP | 6-132747 | 5/1994 |
| JP | 6-149395 | 5/1994 |
| JP | 6-131889 | 6/1994 |
| JP | 6-266596 | 9/1994 |
| JP | 7-93499 | 4/1995 |
| JP | 7-311708 | 11/1995 |
| JP | 8-18018 | 1/1996 |
| JP | 8-69696 | 3/1996 |
| JP | 9-147581 | 6/1997 |
| SU | 1388877 | 4/1988 |
| SU | 1408439 | 7/1988 |
| SU | 1515164 | 10/1989 |
| SU | 1541619 | 2/1990 |
| SU | 1573458 | 6/1990 |
| SU | 1686449 | 10/1991 |
| WO | WO 84/00628 | 2/1984 |
| WO | WO 94/20906 | 9/1994 |

OTHER PUBLICATIONS

Walter Lahti and Dean McCarron, "State of the Art: Magnetic VS Optical Store Data in a Flash", *Byte Magazine*, Nov. 1, 1990. 311, vol. 15, No. 12.

Ron Wilson, Technology Updates, Integrated Circuits, "I-Mbit flash memories seek their role in system design", *Computer Design* 28 Mar. 1, 1989, No. 5, Tulsa OK, US, pp. 30 and 32.

S. Mehoura et al., SunDisk Corporation, Santa Clara, CA. R.W. Gregor et al., AT&T Bell Laboratories, Allentown, PA. 1992 Symposium of VLSJ Circuits Digest of Technical Papers, "EEPROM for Solid State Disk Applications", pp. 24 and 25.

Mendel Rosenblum and John K. Ousterhout, "The Design and Implementation of a Log-Structured File System," 1991, 15 pgs., Berkeley, USA.

Brian Dipert and Markus Levy, *Designing with Flash Memory*, Annabooks, Apr. 1994, 445 pgs.

Science Forum, Inc. "Flash Memory Symposium '95", 1995, 13 pgs. Tokyo.

Ross S. Finlayson and David R. Cheriton, "An Extended File Service Exploiting Write-Once Storage," *ACM Symposium on Operating Systems Principles*, 1987, 10 pgs.

Jason Gait, "The Optical File Cabinet: A Random-Access File System for Write-Once Storage", *Computer*, Jun. 1988, 12 pgs.

Henry G. Baker, *Memory Management*, 1995, Springer-Verlag Heidelberg, Germany, 19 pgs.

Sape J. Mullender and Andrew S. Tanenbaum, "A Distributed File Service Based on Optimistic Concurrency Control", *ACM Press*, 1985, 12 pgs. New York, New York.

Hiroshi Nakamura, Junichi Miyamoto, Kenichi Imamiya and Yoshihisa Iwata, "A Novel Sense Amplifier for Flexible Voltage Operation NAND Flash Memories", VLSI Circuits, 1995, *Digest of Technical Papers*, 2 pgs.

Hiroshi Nakamura, Junichi Miyamoto, Kenichi Imamiya, Yoshihisa Iwata and Hideko Oodaira, "A Novel Sensing Scheme with On-Chip Page Copy for Flexible Voltage NAND Flash Memories", *IEICE Transactions on Electronics*, vol. E79-C, No. 6, pp. 836-844.

Takaaki Nozaki, Toshiaki Tanaka, Yoshiro Kijiya, Eita Kinoshita, Tatsuo Tsuchiya and Yutaka Hayashi, "A 1-Mb EEPROM with MONOS Memory Cell for Semiconductor Disk Application", *Journal of Solid-State Circuits*, vol. 26, No. 4, 5 pgs.

Kai Hwang and Faye A. Briggs, *Computer Architecture and Parallel Processing*, 1984, McGraw-Hill, Inc.

Ron Wilson, "Integrated Circuits; 1-Mb flash memories seek their role in system design", Mar. 1, 1989, 2 pgs. Tulsa, OK.

S. Mehroura, J.H. Yuan, R.A. Cemea, W.Y. Chien, D.C. Guteman, G. Samachisa, R.D. Norman, M. Mofidi, W. Lee, Y. Fong, A. Mihnea, E. Haim, R.W. Gregor, E.P. Eberhardt, J.R. Radosevich, K.R. Stiles, R.A. Kohler, C.W. Leung, and T.J. Mulrooney, "Serial 9Mb F EEPROM for Solid State Disk Applications", symposium, 2 pgs., 1992, Mountain View, CA.

Steven H. Leibson, "Nonvolatile, In-Circuit-Reprogrammable Memories", *EDN Special Report*, Jan. 3, 1991, No. 12, 12 pgs.

Walter Lahti and Dean McCarron, "State of the Art: Magnetic vs. Optical Store Data in a Flash", *Byte Magazine*, 1990, vol. 15, No. 12, 7 pgs.

Ramon Caceres, Fred Douglis, Kai Li and Brian Marsh, "Operating System Implications of Solid-State Mobile Computers", *Workshop on Workstation Operating Systems*, Oct. 1993, pp. 21-27.

Michael Wu and Wily Zwaenepoel, "A Non-Volatile, Main Memory Storage System", *ACM Press*, 1994, 12 pgs., San Jose, CA.

Dave Bursky, "Innovative flash memories match DRAM densities: available with a choice of features, flash memories are finding homes in many systems (including related articles on the origins of flash, and on the differences between NAND and NOR flash memories)", *Electronic Design*, May 16, 1994, vol. 42, No. 10, 9 pgs.

Anthony Cataldo, "New flash enhancements up ante. (Intel's 28F400BV-120 and 28F004BV-120, Atmel's AT29BV010 and AT29BV020, and Samsung Semiconductor's KM29V3200 flash memory devices)" (product announcement), *Electronic News*, Mar. 13, 1995, vol. 41, No. 2056, 4 pgs.

Sam Weber, "Flash modules' portability, reusability, small size valued for a host of APPs—Consumer formats flocking to flash", *Electronic Engineering Times*, Jul. 22, 1996, No. 911, 9 pgs.

Stan Baker, "But Integration Calls for Hardware, Software Changes: Flash designers face the dawn of a new memory age", *Electronic Engineering Times*, Dec. 3, 1990, vol. 41, No. 619, 5 pgs.

Toshiba, MOS Memory (Non-Volatile), 1995, Data Book.

Toshiba, Toshiba MOS Digital Integrated Circuit Silicon Gate CMOS, (TC58NS512DC), Mar. 21, 2001, 43 pgs., Data Book.

Toshiba, Toshiba Corporation, SMIL (Smartmedia Interface Library) Hardware Edition Version 1.00, Jul. 1, 2000, 136 pgs., Data Book.

Toshiba, Toshiba MOS Digital Integrated Circuit Silicon Gate, (TC58512FT), Mar. 5, 2001, 43 pgs., Data Book.

Toshiba, Toshiba MOS Digital Integrated Circuit Silicon Gate, (TC58DVM92A1FT00), Jan. 10, 2003, 44 pgs., Data Book.

Toshiba, Toshiba MOS Digital Integrated Circuit Silicon Gate, (TC58DVG02A1FT00), Jan. 10, 2003, 44 pgs., Data Book.

Toshiba, Toshiba MOS Digital Integrated Circuit Silicon Gate, (TC58100FT), Mar. 5, 2001, 43 pgs., Data Book.

Toshiba, MOS Memory (Non-Volatile), 1996, 279 pgs., Data Book.

"Fifth Biennial Nonvolatile Memory Technology Review," 1993 Conference, Jun. 22-24, 1993, Linthicum Heights, MD, USA.

Dan Auclair, "Optimal Solid State Disk Architecture for Portable Computers", Silicon Valley PC Design Conference, Jul. 9-10, 1991, pp. 811-815.

\* cited by examiner

NON-VOLATILE MEMORY CONTROL

RELATED APPLICATIONS

This application is a continuation of U.S. patent application Ser. No. 11/800,974, filed May 8, 2007 and issued as U.S. Pat. No. 7,944,762 on May 17, 2011, which is a continuation of U.S. application Ser. No. 10/867,800 filed Jun. 14, 2004 now U.S. Pat. No. 7,215,580, issued on May 8, 2007, which is a continuation of U.S. application Ser. No. 10/260,074 filed Sep. 27, 2002 now U.S. Pat. No. 6,751,155 issued Jun. 15, 2004, which claimed the benefit of the priority date of British Application No. 0123416.0, entitled "Non-Volatile Memory Control", filed on Sep. 28, 2001, the contents of which are incorporated by reference herein in their entirety.

TECHNICAL FIELD

The present invention relates generally to a solid state memory system for data storage and retrieval, and to a memory controller for controlling access to a non-volatile memory of a solid state memory system and particularly to a method and apparatus of fast access of the data in the memory system with precise control of power consumption including the control of flash (or non-volatile) memory accesses.

BACKGROUND

It is well known to use solid state memory systems to try to emulate magnetic disc storage devices in computer systems. It is an aim of the industry to try to increase the speed of operation of solid state memory systems to better emulate magnetic disc storage.

A typical memory system comprises a non-volatile (Flash) memory and a controller. The memory has individually addressable sectors where a memory sector is a group of flash memory locations which is allocated for storage of one Logical Sector. A memory sector need not be a physical partition within Flash memory, not contiguous Flash memory locations, so that the memory sector address may be a virtual address conveniently used by the controller. The controller writes data structures to and reads data structures from the memory, and translates logical addresses received from the host to physical (virtual) addresses of the memory sectors in the memory.

An example of such a memory system is illustrated by the Memory System of patent publication number WO 00/49488. In FIG. 1 (prior art), there is illustrated the timing of various operations involved in a multiple sector write to interleaved flash chips forming a flash array described for the memory system of WO 00/49488.

However in many systems, and in particular systems such as portable computers, the maximum level of electrical current is a very important parameter defining the system design, efficiency and cost. For systems, which include memory storage devices, the number of flash memory chips active at the time is a major factor defining the current level. It is therefore important to control the maximum value of electrical current level to avoid high peaks, which can cause higher requirements to the host system power supply. It is also important to be able to change the maximum current level and to compromise on performance if required.

Thus, a need arises to obviate or mitigate at least one of the aforementioned problems.

DETAILED DESCRIPTION

Figure 1:
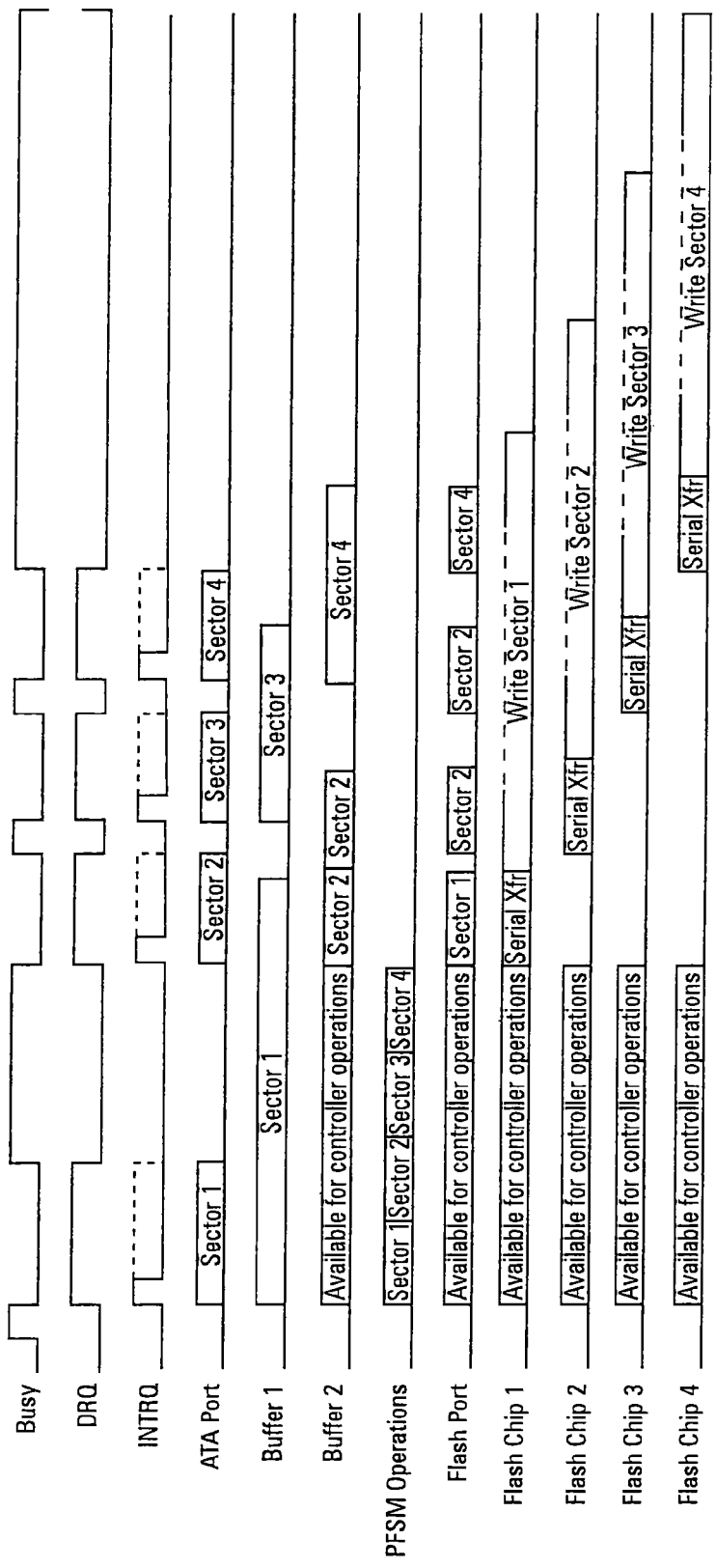
FIG. 1 shows a schematic representation of timing operations of a prior art memory system.
Figure 2:
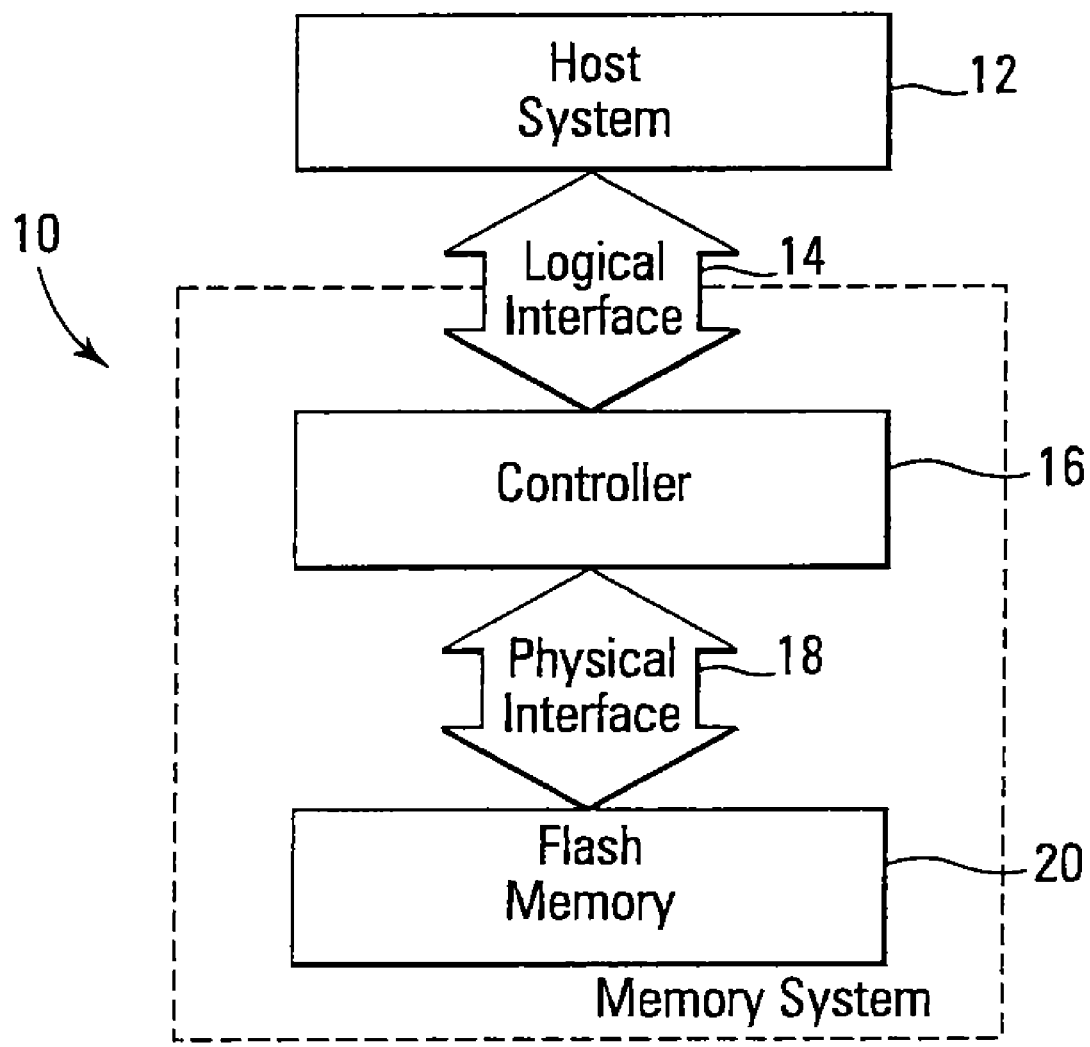
FIG. 2 illustrates a memory system and associated host system in accordance with an embodiment of the present invention.

A Flash disk device, such as that shown in FIG. 2, is a memory system which presents the logical characteristics of a disk storage device to a host system 12, and which uses Flash semiconductor memory 20 as its physical data storage medium. A Flash disk memory system 10 requires a controller 12 to manage the physical storage medium of the system 10 according to algorithms which create the logical characteristics of a disk and, in this case, it is the flash memory 20 and controller 16 which are connected by physical interface 16 which form the memory system 10. The controller 16 of the memory system 10 connects the system 10 to the host 12 via logical interface 14.

In this case the flash memory 20 comprises a plurality of flash chips which are formed of a plurality of flash blocks. The logical interface 14 to the memory system 10 allows data to be written to and read from the system 10 in fixed-size units called sectors, each containing 512 bytes of data, which can be randomly accessed. Each sector is identified by a logical address which in this case is a sequential Logical Block Address (LBA).

In the present arrangement data may be written to a sector even if the sector already includes data. The protocols at the logical interface 14 can, in this case, support read or write access to the system 10 in multi-sector blocks of logically contiguous sector addresses, these protocols conform to industry standards such as ATA, CompactFlash, or MultiMediaCard thus allowing the memory system 10 to be interchangeable between different host systems and not limited to use with host 12.

The physical interface 18 from controller 16 to Flash Memory 20 allows data to be written to and read from Flash memory 20 in fixed-size units which in this case are called physical sectors and each of which can be accessed randomly with each typically having sufficient capacity for 512 bytes of data from the host system plus 16 bytes of overhead data appended by the controller 16. Each physical sector is identified by a physical sector address, which normally has separate components which respectively identify the Flash chip within the memory subsystem, the Flash block within the Flash chip, and the physical sector within the Flash block of the memory 20 to which the physical sector is written.

Within the system 10 shown, data may only be written to a physical sector if the sector has previously been erased. The Flash memory 20 is erased in response to a command at the physical interface in units of a Flash block, which typically includes 32 physical sectors. The relative times for performing operations within the Flash system 10 to read a physical sector, program a physical sector, and erase a Flash block are typically in the ratio 1:20:200.

In the arrangement of FIG. 2 the controller 16 is a Cyclic Storage controller which is a Flash media management controller in which a method of ensuring uniformity of distribution of use is implemented wherein the media management algorithms which implement this method are implemented as firmware by a processor within the controller.

Figure 3:
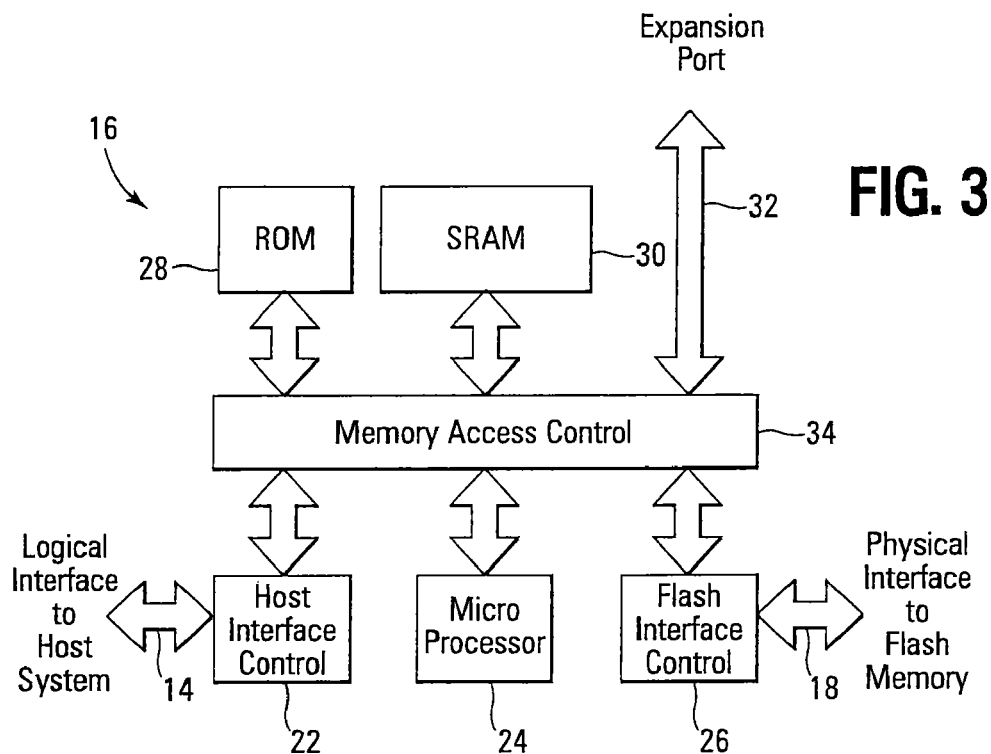
FIG. 3 shows a schematic representation of the hardware architecture of the controller of the memory system of FIG. 2.

With reference to FIG. 3 there is shown optimized hardware architecture which is defined for the cyclic Storage controller 16. In this case the controller hardware is a dedicated architecture in a separate integrated circuit.

The controller 16 comprises host interface control block 22, microprocessor 24, flash interface control block 26, ROM 28, SRAM 30 and expansion port 32, each of these being inter-connected by memory access control bus 34.

Cyclic Storage Flash media management algorithms are implemented by firmware running on microprocessor 24 and the controller 16 is responsible for all Flash media management functions and for the characteristics of the logical interface 14 presented to host 12.

The host interface control block 22 provides the path for data flow to and from host system 12 via logical interface 14.

As, in this case, the controller 16 is in the form of a dedicated integrated circuit the host interface control block 22 provides logical interface 14 which conforms to an industry standard protocol as well as a command register and set of taskfile registers which provide the route for the microprocessor 24 to control the logical characteristics of the interface 14.

The host interface control block 22 also allows for a sector of data to be transferred in either direction across the logical interface 14 between to the host system 12 and the controller's SRAM 30 by a direct memory access (DMA) operation without intervention from the microprocessor 24.

The Flash interface control block 26 provides the path for data flow to and from Flash memory 20, and controls all operations which take place in the Flash memory 20. The operations taking place in Flash memory 20 are defined and initiated by the microprocessor 24, which loads parameter and address information to the flash interface control block 26.

The set of operations which typically take place are the transfer of a physical sector to Flash memory 20, the transfer of a physical sector from Flash memory 20, the programming of a physical sector into flash memory 20, the erasing of a Flash block, and the reading of the status of flash memory 20.

Similarly a physical sector of data may be transferred in either director across the physical interface 16 between the Flash memory 20 and the controller's SRAM 30 by DMA operations without intervention from the microprocessor 24. The organization of the 512 bytes of host data and 16 bytes of overhead data within a physical sector which is transferred to Flash memory 20 is determined within the Flash interface control block 26, under the control of parameters loaded by the microprocessor 24.

The Flash interface control block 26 also generates a 12-byte error correcting code (ECC) which is transferred to Flash memory 20 and programmed as overhead data within each physical sector, and which is also verified when a physical sector is transferred from Flash memory 20.

The microprocessor 24 controls the flow of data sectors through the memory access control bus, or datapath, 34 or of the controller 16, implements the Flash media management algorithms which define the sector, controls data storage organization in the Flash memory 20, and defines the characteristics of the logical interface 14 to host system 12. In this case the microprocessor 24 is a 32-bit RISC processor.

The memory access control bus 34 allows transfer of information between the microprocessor 24, host interface control block 22, and the Flash interface control blocks 16, as well as between the host interface control block 22, the flash interface control block 26 and a memory block 30.

The microprocessor 24, host interface control block 22, and Flash interface control block 26 may each be the master for a transaction on the memory access control bus 34. Bus access is granted to requesting masters on a cycle-by-cycle basis.

The SRAM block 30 stores all temporary information within the controller 16, this storing function includes the buffering of sector data and storage of control data structures and variables, as well as firmware code.

The ROM 28 is included in the controller 16 for storage of code for execution by the microprocessor 24, or of information required by other hardware blocks within the controller.

The inclusion in the controller architecture of an expansion port 32 gives access to external hardware functions, RAM or ROM from the memory system 10.

During the operation of the controller all sector data being transferred between the logical interface 14 to host system 12, and the physical interface 18 to Flash memory 20 is buffered in the SRAM 30. Sufficient capacity in the SRAM 30 is allocated for buffering of two sectors of data to allow concurrent transfers of successive sectors at the host and Flash interfaces. Data transfer between the logical host interface 14 and SRAM 30 is performed by DMA with the host interface control block 22 acting as bus master.

Data transfer between the physical Flash interface 18 and SRAM 30 is performed by DMA with the Flash interface control block 26 acting as bus master. Data to be written to sectors in Flash memory 20 is stored in the SRAM memory 30 and is transferred by direct memory access under the control of the Flash interface control block 26 via the physical interface to Flash memory 18. 512 bytes of user data to be written in a sector had previously been supplied by host system 12 via the logical interface 14 and had been transferred by direct memory access under the control of the host interface control block 22 to the SRAM memory 30. Programming of data in a sector in Flash memory 20 is accomplished by the controller 16 by sending an address and command sequence at the physical interface 18, followed by 528 bytes of-data plus ECC, followed by a program command code.

The transfer of data for a sector between a host system and the controller's SRAM 30, and between the SRAM 30 and Flash memory, is controlled by firmware running on the microprocessor 24 with the controller 16 being responsible for all Flash media management functions and for the characteristics of the logical interface 14 present to host 12.

As the controller 16 is in the form of a dedicated integrated circuit, the host interface control block 22 provides a logical interface which conforms to an industry standard protocol, and a command register and set of taskfile registers provide the route for the microprocessor 24 to control the logical characteristics of the interface 14. Command, address and parameter information is written to these task file registers by the host 12, and read by the microprocessor 24 for execution of the command. Information is also been written to the registers by the microprocessor 24 for return to the host 12.

Figure 4:
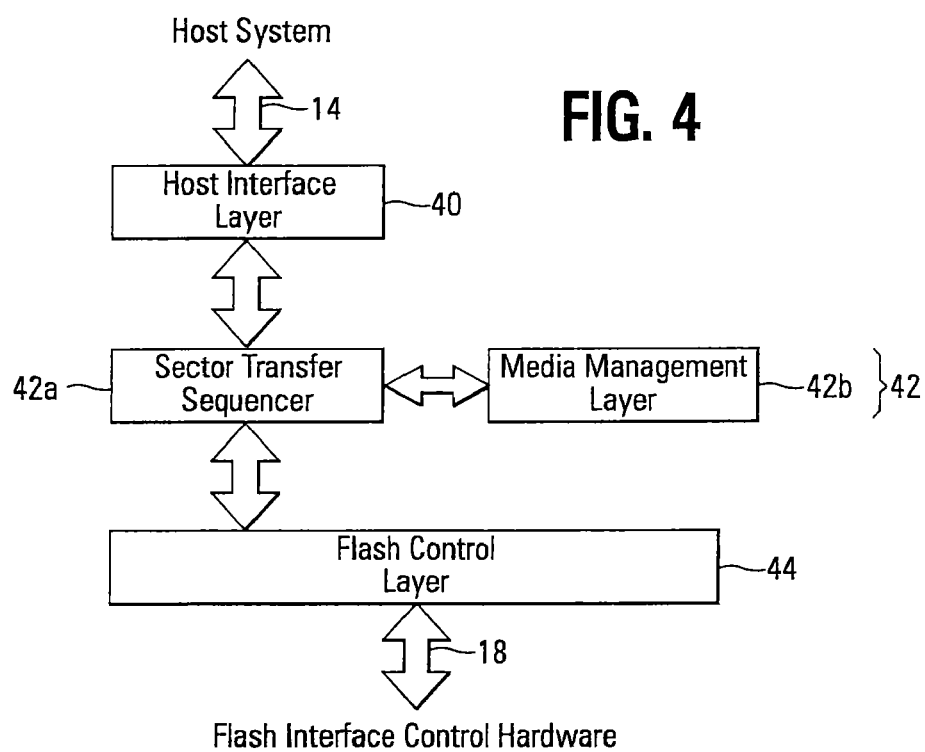
FIG. 4 shows a schematic representation of the firmware executed in the microprocessor of the controller of FIG. 3.

In FIG. 4 there is illustrated the layered structure of the firmware which performs the Cyclic Storage Flash media management operations. The firmware has three layers, the first being the host interface layer 40, the second layer 42 comprising the sector transfer sequencer 42a and the media management layer 42b and the third being the flash control layer 44.

These three firmware layers 40, 42 and 44 control the transfer of data sectors between the logical interface 14 to host 12 and the physical interface 18 to Flash memory 20. However, the firmware layers do not directly pass data, instead data sectors are transferred by the hardware blocks of the controller 16 and therefore do not pass through the microprocessor 24.

The host interface layer 40 supports the full command set for the host protocol. It interprets commands at the host interface 14, controls the logical behavior of the interface 14 according to host protocols, executes host commands not associated with the transfer of data, and passes host commands which relate to data in Flash memory to be invoked in the layers below. Examples of such commands are.

Read logical sector (single or multiple),
Write logical sector (single or multiple),
Erase logical sector (single or multiple), as well as other disk formatting and identification commands.

The sector transfer sequencer 42a receives interpreted commands relating to logical data sectors from the host interface layer 40 and thus invokes the Flash media management layer 42b for logical to physical transformation operations, and invokes the Flash control layer 44 for physical sector transfers to or from Flash memory. The sector transfer sequencer 42a also performs sector buffer memory management. Another function of the sequencer 42a is to create a sequence of sector transfers, at the host interface 14 and Flash memory interface 18, and a sequence of operations in the media management layer 42b, in accordance with the command received from the host 12 and the level of concurrent operations which is configured for the Flash memory 20.

The media management layer 42b performs the logical to physical transformation operations which are required to support the write, read or erasure of a single logical sector. This layer is responsible for the implementation of Cyclic Storage media management algorithms.

The Flash control layer 44 configures the Flash interface control block 26 hardware to execute operations according to calls from the sector transfer sequencer 42a or media management layer 42b.

The media management functions which are implemented within the media management layer 42b of the controller firmware create the logical characteristics of a disk storage device in the memory system 10 which uses Flash semiconductor memory 20 as the physical data storage medium.

The effectiveness of the media management performed by the media management functions of the media management layer 42b is measured by its speed for performing sustained writing of data to the memory system 10, its efficiency in maintaining its level of performance when operating with different file systems, and in this case, in host 12, and the long-term reliability of the Flash memory 20.

Data write speed is defined as the speed which can be sustained when writing a large volume of contiguous data to the memory system 10. In some cases, when the sustained data write rate of a memory system is being tested, the volume of data to be written may exceed the capacity of the memory system 10 and therefore logical addresses may be repeated.

Sustained write speed is determined by the sector data transfer speed at the logical interface 14 to the host 12, and the physical interface 18 to Flash memory 20, as well as the overhead percentage of accesses to Flash memory 20 at the physical interface 18 for Flash page read and write operations and Flash block erase operations which are not directly associated with storage of data sectors written by the host 12 at the logical interface 14. In this case the control data structures and algorithms which are employed should ensure that access to Flash memory 20 for control functions is required at a much lower frequency than for host sector write. The sustained write speed is also determined by the processing time within the controller 16 for media management operations, and the page read and program times, and block erase times within the Flash memory 20.

In order for the memory system to operate efficiently when having file systems with different characteristics, the Media management algorithms for the organization of host data and control data structures on Flash memory 30 are appropriately defined and data write performance is maintained in each environment.

In a first embodiment, the file systems implementing the MS-DOS standard are provided with at least one of the following characteristics: the host 12 writing data sectors in clusters using multiple sector write commands; the host 12 writing data sectors using single sector write commands; the host 12 writing some sectors with single sector write commands in an address space which is shared with clustered file data; the host 12 writing non-contiguous sectors for MS-DOS director and FAT entries with single sector write commands; the host 12 writing non-contiguous sectors for MS-DOS directory and FAT entries interspersed with contiguous sectors for file data; and/or the host may rewrite sectors for MS-DOS directory and FAT entries on a frequent basis.

It is a feature of flash memory, and in this case the Flash memory 20 of the memory system 10, that it has a wear-out mechanism within the physical structure of its cells whereby a block of flash memory may experience failure after a cumulative number of operations. Typically, this is in the range of 100,000 to 1,000,000 program/erase cycles. In light of this the cyclic storage controller 16 of the present arrangement implements a process of wear-leveling to ensure that "hot-spots" do not occur in the physical address space of the Flash memory 20 and that utilization of Flash blocks is uniformly distributed over a prolonged period of operation.

Cyclic Storage media management algorithms are implemented within memory system 10 and perform the Media management operation of the physical Flash memory 20 within the system 10. The cyclic storage media management algorithms comprise four separate algorithms, namely the Data Write algorithm which controls the location for writing host information to, the Block Erase algorithm which controls erasure of areas of Flash memory 20 containing obsolete information, the Block Sequencing algorithm which controls the sequence of use of Flash blocks for storing information, and the Address Translation algorithm which controls the mapping of host logical addresses to physical memory addresses.

The method of Cyclic Storage media management implemented by these algorithms embodies the principle that data is written at physical sector locations in Flash memory 20 which follow the same order as the sequence in which the data is written. This is achieved by writing each logical data sector at a physical sector position defined by a cyclic write pointer.

Figure 5A:
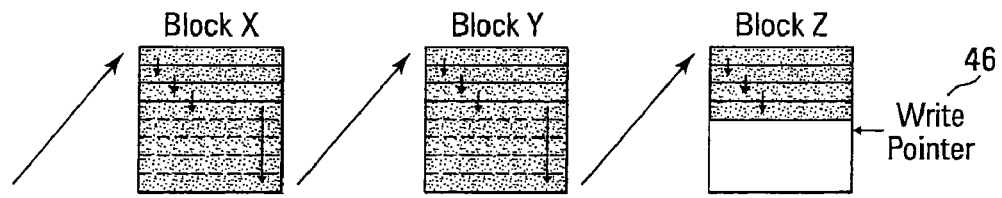
FIG. 5A shows a schematic representation of the data write operation used by the controller of FIG. 3.

A schematic representation of the write operation of the cyclic storage media management method is shown in FIG. 5A. The write pointer, in this case data write pointer (DWP) 46 moves sequentially through the sector positions of Flash block X in Flash memory 20, and continues through the chain of blocks & and Z in a manner defined by the block sequencing algorithm. Each block X, Y and Z is a physical structure in Flash memory 20 which, in this case, comprises 32 sector locations which can be erased in a single operation.

Figure 5B:
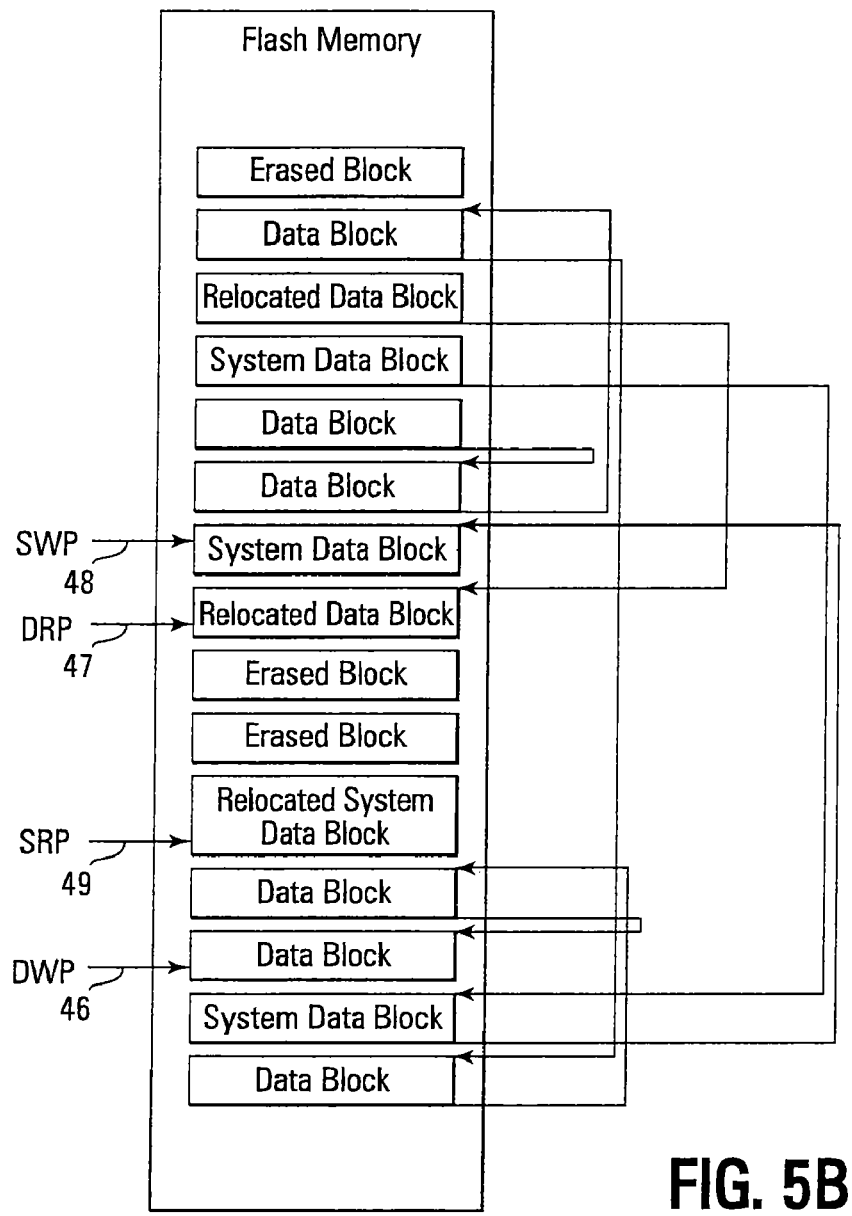
FIG. 5B illustrates read and write pointer operations.

As is illustrated in FIG. 5B logical data sectors are generally written in files by a file system in the host 12, and the Cyclic Storage Data Write Algorithm locates the first sector of a file at the next available physical sector position following the last sector of the preceding file. When a file is written by host 12 using logical sectors for which valid data already exists in the device, the previous versions of the sectors become obsolete and the blocks containing them are erased according to the Block Erase Algorithm. In order to erase a block containing obsolete file sectors it is, in some cases necessary to relocate some valid sectors of another file. This generally occurs when a block includes sectors of the head of a file, as well as sectors with unrelated logical addresses from the tail of a different file.

A second write pointer in this case data relocate pointer DRP 47 is used for writing relocated sectors in order to avoid sectors of one file fragmenting a block containing sectors of another file. The use of a separate relocation pointer significantly reduces the fragmentation of blocks containing a file, leading to minimum requirement for sector relocation and consequent maximum file write performance.

A host file system is used which also writes sectors containing system information, such as directory or FAT sectors in the DOS file system, and these are generally written immediately before and after a group of sectors forming a file. A separate system pointer, system write pointer SWP 48 is used for this host file system in order to define the physical write location for system sectors, which are identified by their logical address, in order to separate system sectors from file data sectors and avoid them being treated in the same way. This avoids a small group of system sectors being "sandwiched" between the tail of one file and the head of another. These system sectors contain information about many files, and are generally re-written much more frequently than data for a file. "Sandwiched" system sectors would cause frequent relocation of file data sectors and thus the use of system pointer SWP 48 minimizes the requirement for data sector relocation and maximizes file write performance.

A fourth pointer, system relocate pointer SRP 49 is used for relocation of system sectors, analogous to the relocation pointer DRP 47 for file data sectors.

To summarize, the four write pointers are:
Data write pointer, DWP 46 which is used to define the physical location for writing file data sectors transmitted by a host system;
System write pointer, SWP 48 which is used to define the physical location for writing system sectors transmitted by a host system wherein system sectors are identified by their logical address, in accordance with the characteristics of the host file system in use;
Data relocation pointer, DRP 47 which is used to define the physical location for writing file data sectors which must occasionally be relocated prior to a block erasure for recovery of capacity occupied by obsolete file data sectors; and
System relocation pointer, SRP 49 which is used to define the physical location for writing system sectors which are being relocated prior to a block erasure for recovery of capacity occupied by obsolete system sectors.

A block must contain data associated with only a single write pointer and this results in four separate chains of blocks existing, one for each write pointer. However, the same write and relocation algorithms of the cyclic storage algorithms apply to each write pointer 46, 47, 48 and 49.

This scheme for locating a sector to be written at the first available location following the preceding sector, combined with usage of multiple write pointers, is fully flexible, and provides high performance and total compatibility for all host write configurations, including single sector data and data in clusters of any size.

However, the Cyclic Storage media management method is defined not to allow the existence of a large number of obsolete data sectors and nor to implement background operations for functions such as garbage collection. Typically only two blocks containing obsolete sectors are allowed to exist for each of the Data Write Pointer DWP 46 and System Write Pointer SWP 48, and block erasure is performed as a foreground operation during sector write sequences.

This method of management means that the logical capacity of the flash memory does not have to be reduced to allow for the existence of a large volume of obsolete data, the data integrity is significantly improved by the absence of background operations, which are susceptible to interruption by power-down initiated by the host; and the pauses in data write sequences are short because erase operations are required for only a single block at a time.

If an obsolete data sector is created in a new block associated with either of the write pointers, then the existing "obsolete block" is eliminated by erasure, following sector relocation within the blocks if required.

Erase sector commands sent from a host 12 are supported by marking the target sector as obsolete, and allowing its erasure to follow according to the Block Erasure algorithm.

The Cyclic Storage block sequencing algorithm determines the sequence in which blocks within the flash memory 20 are used for the writing of new or relocated data, and is therefore responsible for ensuring that no block experiences a number of write/erase cycles which exceeds the endurance limit specified for the Flash memory system 10 which is being used.

When a logical sector is written by the host, any previous version which exists in the memories system is treated as obsolete data. The block erase algorithm ensures that blocks which contain obsolete data sectors are erased immediately, to allow recovery of the capacity occupied by these sectors. The physical memory capacity of the system 10 is therefore occupied by valid data for logical sectors written by the host, plus a small number of proprietary Cyclic Storage control data structures and a number of erased blocks. Immediately after initial formatting, of the flash memory 20 the capacity of the memory 20 consists almost entirely of erased blocks. When the host 12 has written at least once to all sectors in its logical address space, the die is considered to be logically full and its physical capacity is occupied almost entirely by valid data sectors, with a small number of erased blocks maintained for correct device operation. An increased number of erased blocks will be created only if the host 12 executes commands to erase logical sectors.

Erased blocks which are allocated for use by one of the write pointers, or for storage of control data structures are taken from a pool of available erased blocks. A block is never erased in response to a need to perform a write operation to that specific block, the block sequencing algorithm determines the order of allocation for data write operations of blocks in the erased pool. The next available block according to the algorithm is allocated, independent of whether the requirement is for use by one of the write pointers or for a control data structure.

The implementation of these algorithms which perform the cyclic storage media management allows increased system flexibility by operating on individual sectors of the flash memory 20 and separately tracking the logical to physical address mapping of every sector in its logical address space. A sector address table is maintained in the Flash memory 20 which includes the physical address for every logical sector. In addition, every sector is written with a header containing its logical address, providing a means of verifying sector identity and ensuring maximum data integrity.

The data write algorithm, with its use of cyclic write pointers, provides the capability for tracking the sequence of sector writing using the logical addresses in the headers of sectors in sequential physical positions. This feature provides total data security even when the logical to physical address mapping records for recently written sectors are temporarily held in volatile controller memory SRAM 30 and not in Flash memory 20. Such temporary records can be reconstructed from the data sectors in Flash memory 20 when a system 10 in which the Cyclic Storage algorithms are implemented is initialized. It is therefore possible for the sector address table in Flash memory 20 to be updated on an infrequent basis, leading to a low percentage of overhead write operations for control data and a high sustained data write rate.

Figure 6:
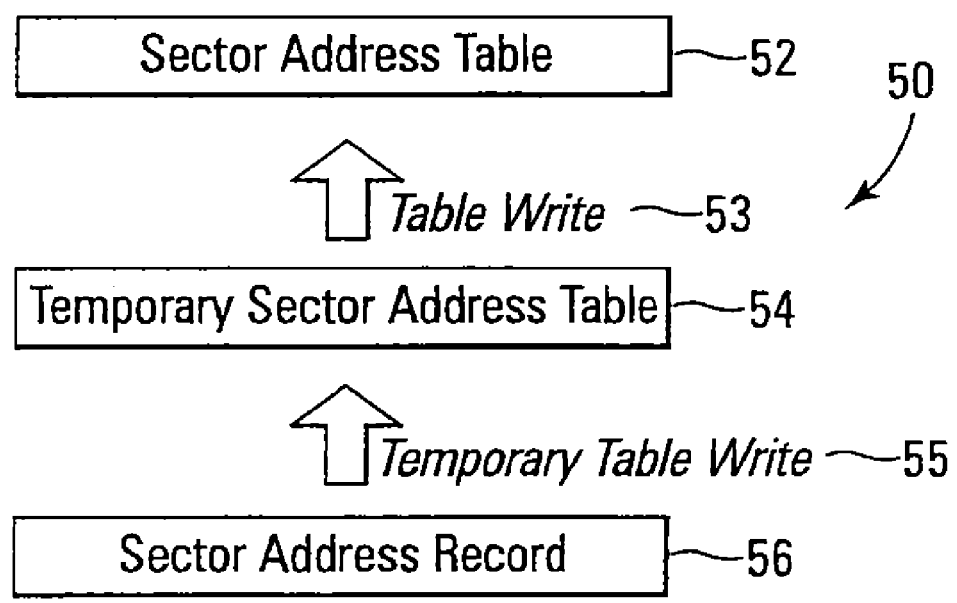
FIG. 6 shows a schematic representation of the hierarchy of mapping structures of the address translation process used by the controller of FIG. 3.

In FIG. 6 there is shown a schematic representation of the address translation process which uses a three level hierarchy of mapping structures 50 which is performed in the memory system 10.

The three levels of the hierarchy are the sector address table 52, the temporary sector address table 54 and the sector address record 56.

The top level of the hierarchy of the mapping structures is the sector address table 52, which is a master table containing a physical address for every logical sector stored in the system 10 and which is stored in Flash memory 20. Structures in the two lower levels of the hierarchy 54 and 56 provide the means for reducing the frequency at which write operations must occur to the sector address table.

The sector address record 56 is a list stored in the controller's volatile memory SRAM 30 of logically contiguous sectors which have been written to system 10. This list allows the physical address of any logical sector which it includes to be determined without need for access to Flash memory 20. It may also be reconstructed during device initialization from the sequence of recently-written sectors which may be traced in the Flash memory 20. The intermediate temporary sector address table 54 is contained in Flash memory 20 and is updated with the contents of the sector address record 56 when the list becomes full. The intermediate temporary sector address table 54 is in the same format as the sector address table 52, and allows physical address data updates to specific blocks of the sector address table 52 to be accumulated to allow a more efficient table write process to be performed. The temporary table 54 allows the physical address of any logical sector contained in it to be determined without need for access to the sector address table 52.

This hierarchy of mapping structures 50 is maintained with an infrequent requirement for write operations to Flash memory and efficiently supports logical to physical address translation in such a way that total security of sector address information is provided, even if electrical power is unpredictably removed from the system 10.

The data structures required to support the Cyclic Storage media management algorithms are stored principally in Flash memory 20 together with the host data sectors, with only a very limited amount of control data being held temporarily in the control processor's volatile RAM 30. Information held in the volatile memory 30 is non-critical, and can be reconstructed from Flash memory 20 if the power supply is interrupted.

The controller 16 in Flash memory system 10 as described above, may operate on only one array within the Flash memory 20 at a time. Each array is a group of Flash memory storage cells within which only a single sector program operation or block erase operation may be performed at any one time. In this case the array is a complete Flash chip. The controller is designed to be capable of performing program operations concurrently on sectors within different arrays or erase operations concurrently on blocks within different arrays. The controller 16 can address, program and check current status of any array within the Flash memory 20 independently from others.

Each sector is a unit of physical storage in Flash memory 20 which is programmed in a single operation. In the present arrangement, which comprises NAND Flash memory chips, a sector equivalent to a page within the Flash array and has a capacity of 528 bytes. In this case, the each Flash chip is considered to comprise four arrays, each of which can be programmed with one sector at any time.

The scheduling of transfer, i.e., the ordering of sector data is controlled by the sector transfer sequencer block 42a shown in FIG. 4 and is explained in greater detail with reference to FIGS. 7 to 11. The transfer of data at the host interface 14 is independent of transfer of data at the physical interface to Flash memory 18 of memory system 10, and the burst transfer rate at the host interface is determined by the host 12. Several different methods of scheduling the transfer of sector data maybe implemented by sector transfer sequencer firmware, depending on the way in which blocks and pages in the Flash memory 20 are addressed by the controller 16. The methods described assume that sector data is supplied by the host and stored in SRAM 30 at a rate which is sufficient to supply sector data for transfer to Flash memory 20 as described.

Figure 7:
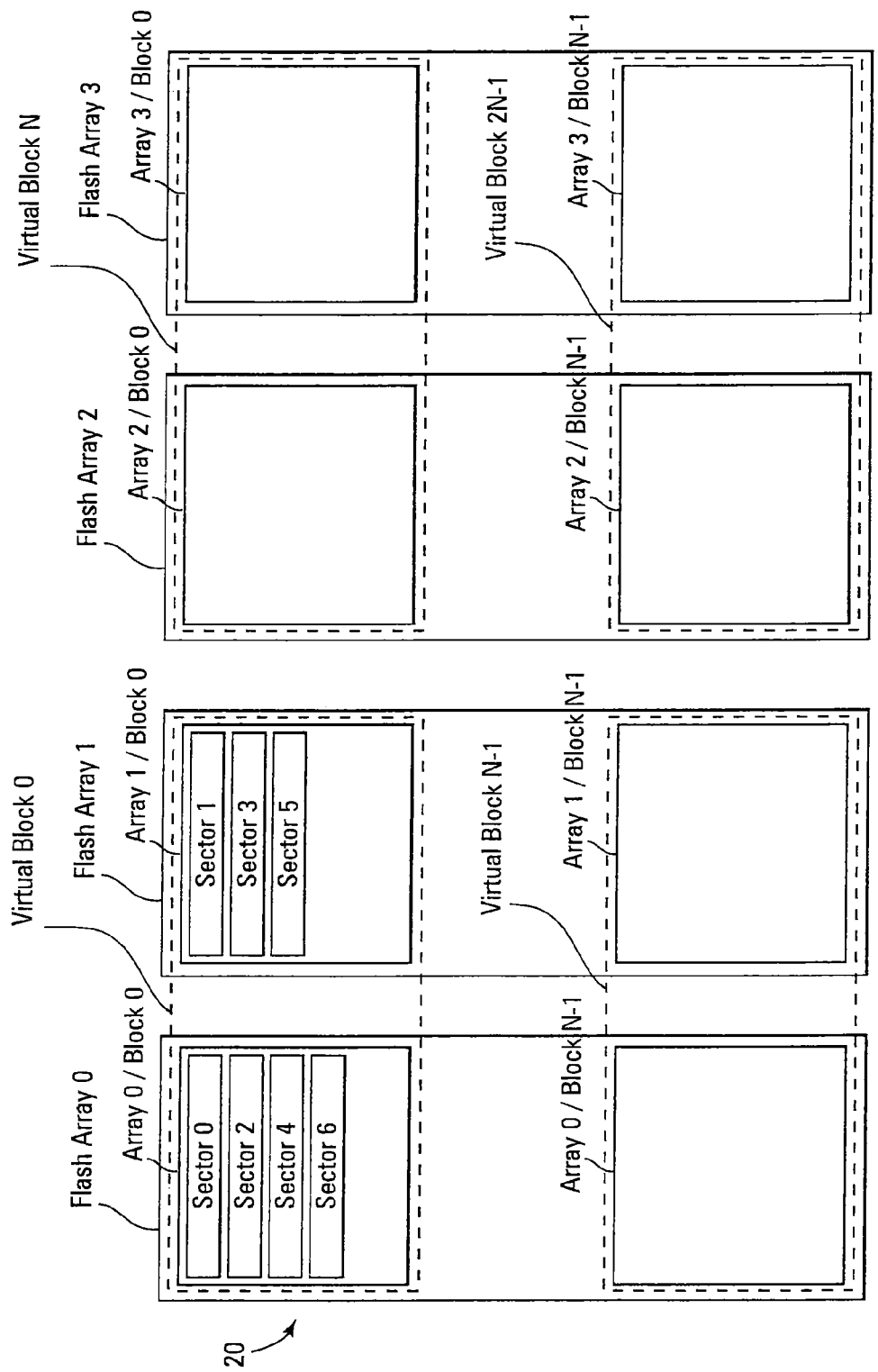
FIG. 7 illustrates a schematic representation of a method of scheduling the transfer of sector data according to a first embodiment of the present invention.

With reference to FIG. 7, there is shown a first embodiment of a method of scheduling the transfer of sector data which the controller may use to address blocks and pages within memory system 10 wherein Flash memory 20 comprises four Flash arrays 0, 1, 2 and 3, where the controller 16 is required to initiate concurrent page program or block erase operations in two arrays simultaneously. The arrays are linked in pairs, and the corresponding blocks 0 with the same addresses within the linked arrays are treated as a single virtual block 0. As shown, block 0 in Flash array 0 is linked with block 0 in Flash array 1 to form virtual block 0. The N blocks in each of Flash arrays 0 and 1 are linked to form N virtual blocks, labeled 0 to N−1, and the N blocks in each of Flash arrays 3 and 2 are linked to form a further N virtual blocks, labeled N to 2N−1. The order of writing sectors within each virtual block is determined by the movement of the write pointer, which alternates between the constituent blocks as it moves sequentially through the sectors in the virtual block.

Figure 8:
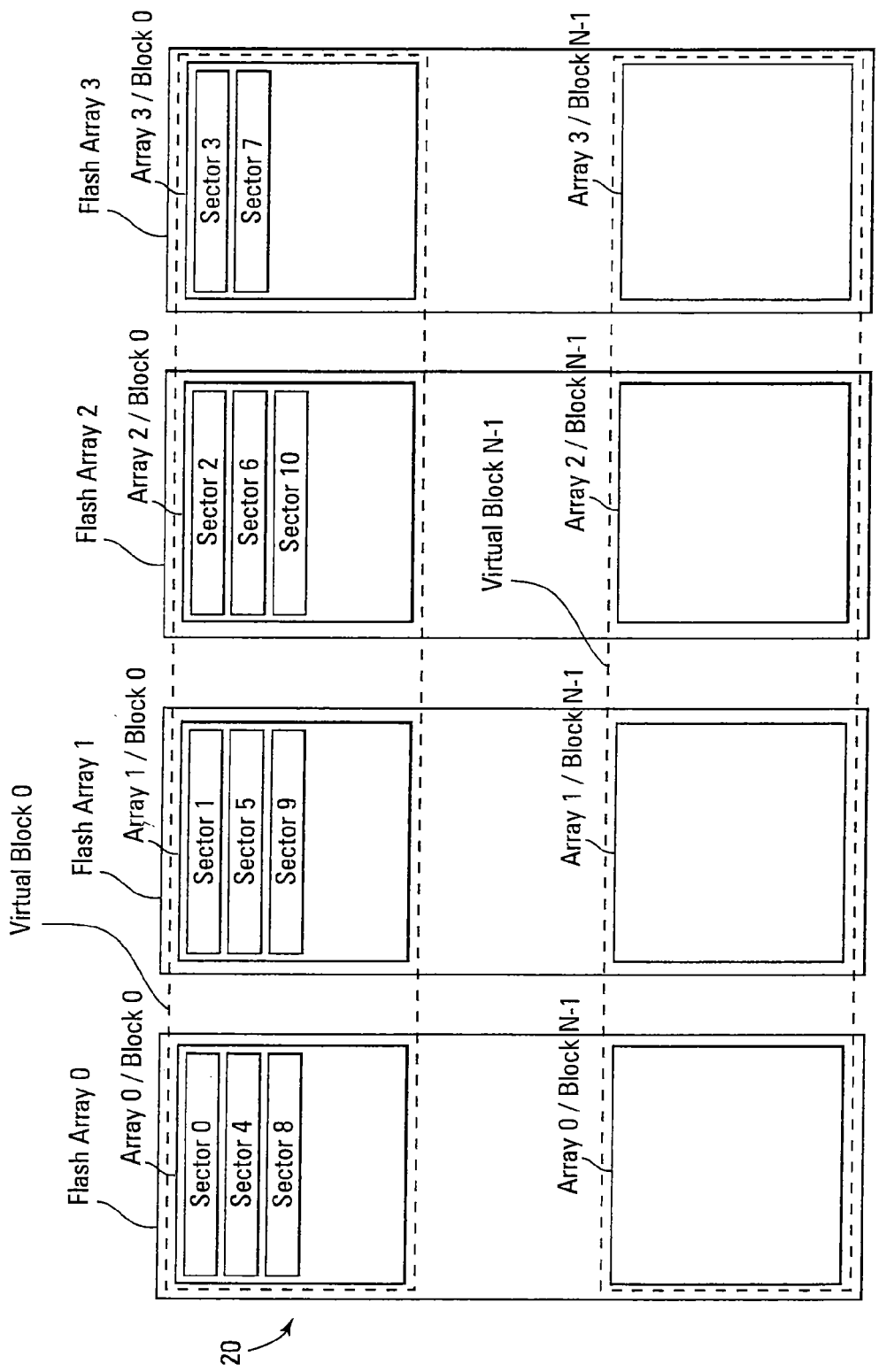
FIG. 8 depicts a schematic representation of a method of scheduling the transfer of sector data according to second embodiment of the present invention.

In FIG. 8 there is shown a second embodiment of a method which the controller may use to address blocks and pages within memory system 10 wherein Flash memory 20 comprises four Flash arrays, where it is necessary for the controller 16 to initiate concurrent page program or block erase operations in four arrays. All four arrays are linked, and the corresponding blocks with the same addresses within each of the linked arrays are treated as a single virtual block. As can be seen, blocks 0 in Flash arrays 0 to 3 are linked to form virtual block 0. The N blocks in each of Flash arrays 0 to 3 are linked to form N virtual blocks, labeled 0 to N−1. The order of writing sectors within a virtual block is determined by the movement of the write pointer, which moves through the corresponding sectors in blocks 0 to 3 and then increments to the next sector in block 0, as it moves sequentially through the sectors in the virtual block.

The blocks within the Individual Flash arrays which are linked to form a virtual block may themselves comprise multiple smaller adjacent physical blocks which are stacked together.

Program operations may be performed substantially concurrently on one sector from each of the constituent blocks forming a virtual block.

Figure 9:
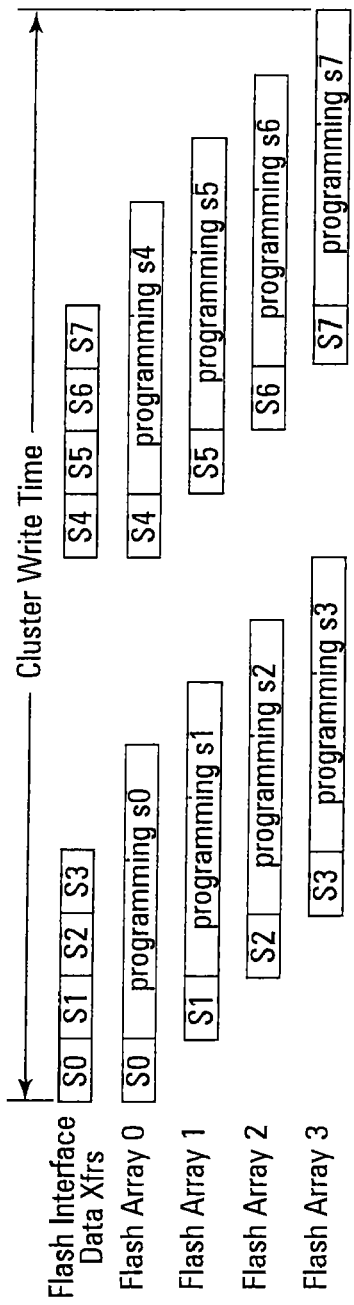
FIG. 9 shows a schematic representation of a method of scheduling the transfer of sector data according to third embodiment of the present invention.

With reference to FIG. 9, there is shown a third embodiment of a method of concurrently programming sectors 0, 1, 2, and 3 which are shown in Flash arrays 0, 1, 2 and 3 of FIG. 8. Data for sector 0 is transferred byte serially to Flash array 0 across the physical interface to Flash memory 20, and then a program command is sent by the controller 12 to Flash array 0 to initiate the program operation. Whilst sector 0 is being programmed, the controller 12 transfers data for sector 1 to Flash array 1 and initiates a program operation for it. The same is done for sectors 2 and 3. Sectors 0 to 3 are programmed in Flash arrays 0 to 3 substantially concurrently with each other, and the speed of transferring and programming data to sectors in the Flash memory is much higher than can be achieved by programming only one Flash array at a time. When the program operations in Flash arrays 0 to 3 have all completed, the process is repeated for sectors 4 to 7. A shared busy/ready line from the Flash arrays can be used to signal when all arrays have completed programming sectors 0 to 3 and when there is no Flash array active. However, the status of all the arrays can alternatively be polled independently.

Figure 10:
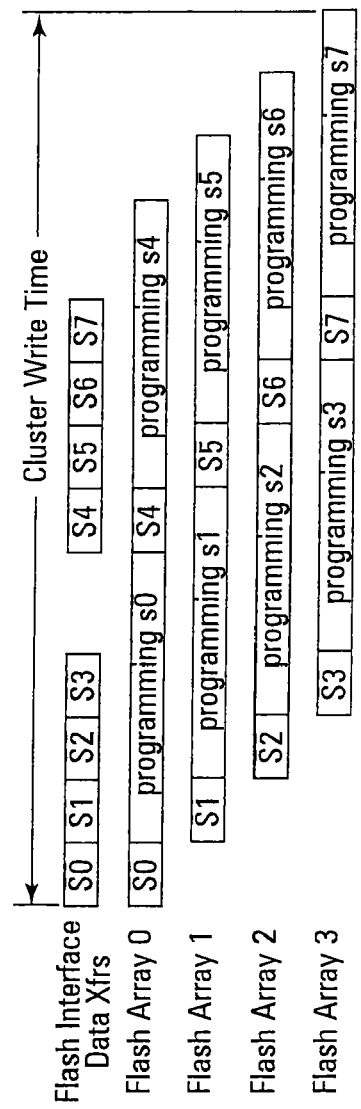
FIG. 10 shows a schematic representation of a method of scheduling the transfer of sector data according to fourth embodiment of the present invention.

In FIG. 10 there is shown a fourth embodiment of a sequence for transferring sector data to and initiating programming operations in Flash arrays 0 to 3. The sequence described for sectors 0 to 3 with reference to FIG. 9 is performed, but upon the completion of the programming operation in a Flash array, sector data is immediately transferred for the following programming operation in that array. The status of each array is polled independently to find when an operation in the array has completed. Alternatively, independent ready/busy signals from every array can be used. This increased pipelining of the sector data transfer and sector programming provides further increased speed for writing sector data in the Flash memory.

Each of these methods detailed in the above described embodiment may be used for writing sector data which is being relocated from another sector in Flash memory, as well as sector data which has been supplied by a host system.

The order of sectors being concurrently programmed in different Flash arrays need not follow the order shown in FIG. 8, that is, sequential order need not be used. It is possible to program any sector from a Flash array concurrently with any other sector from another array, provided that no two sectors from the same array are used. For example, it would be possible to transfer and then program a group of four sectors FIG. 8 in the order sector 10, sector 3, sector 1, then sector 4. However, the use of a cyclic write pointer which moves sequentially through the addresses of a virtual block means that it is most common for sector addresses to be in sequential order. The first sector of a group of four for which data is being concurrently transferred and programmed need not be located in Flash array 0. The sectors may, for example, be transferred in the order sector 2, sector 3, sector 4, and sector 5.

The write time for a cluster of sectors can be expressed as a function of the transfer time to Flash memory 20 for sector data and programming time for a sector in Flash memory 20. The programming time is typically 200 microseconds and is much longer than transfer time, which is typically about 30 microseconds. The time associated with flash chip addressing and initiation of data transfer and programming by the controller is usually not significant. For the example shown in FIG. 9, cluster write time is given by $$\text{Cluster Write Time}=8*\text{Sector data transfer time}+2*\text{Programming time}.$$

For the example shown in FIG. 10, cluster write time is given by $$\text{Cluster Write Time}=5*\text{Sector data transfer time}+2*\text{Programming time}.$$

As detailed above, all 4 flash memory arrays are being accessed, however this results in the electrical current level being high (=4*array current) as well as performance is on the maximum.

Figure 11:
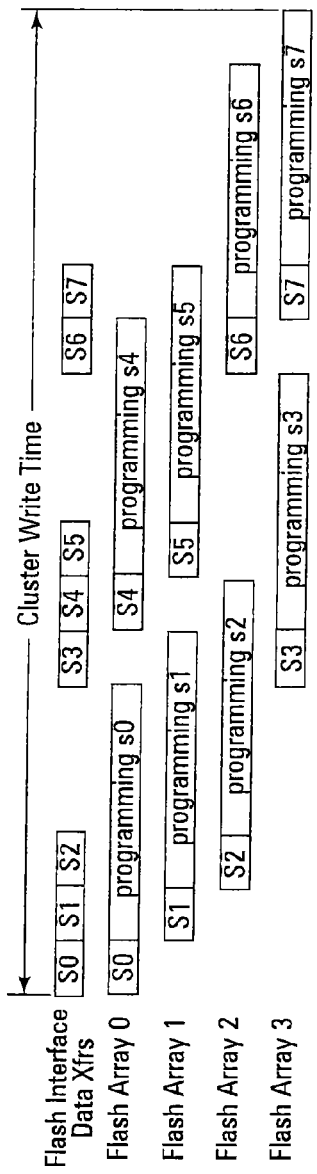
FIG. 11 shows a schematic representation of a method of scheduling the transfer of data whilst limiting the number of active arrays according to the present invention.

With reference to FIG. 11, there is illustrated a first embodiment of a method of allowing the limiting of the number of flash memory arrays accessed at a time in order to control the current. As can be seen, FIG. 11 illustrates a pipelined sequence for transferring sector data to and initiating programming operations in flash arrays 0 to 3 but the maximum number of active flash memory arrays is limited to three. The sequence described for sectors 0 to 2 with reference to FIGS. 9 and 10 is performed, but then the number of active arrays is three and therefore the controller 16 waits for at least one of the arrays to be completed, in this case chip 0. Whenever the number of active arrays is lower than three, sector data is immediately transferred for the following programming operation in the next chip. In other words, before accessing any flash array the number of currently active arrays is always checked against the allowed limit which in this case is three. Thus, the electrical current level is regulated.

For the example illustrated by FIG. 11 the cluster time will be $$\text{Cluster Write Time}=4*\text{Sector data transfer time}+3*\text{Programming Time}$$

Similarly, the number of active arrays can be limited to two or one. For the same case of a 4-way interleaved memory system where the active array limit is two (not shown) the cluster time will be $$\text{Cluster Write Time}=5*\text{Sector data transfer time}+4*\text{Programming Time}.$$

A more complex method of performing the control of current can be used when the flash memory 20 of the system 10 has different electrical parameters for different flash operations, i.e., the electrical parameters for read, transfer, programming and erase operations are all different. For simplicity the arrays are as before, programmed in numerical order 0 to 3. The status of every array is polled independently to find a time when the chip completed. Otherwise, independent ready/busy signals from every array can be used. This method uses the same method of pipelining but creates extra on-purpose delay in order to limit the electrical level.

The flash access control combined with the pipelining proves a very efficient usage of flash memory performance and still gives a high speed for writing sector data in the flash memory while limiting the electrical power. The method allows a defined number of active arrays, in this case three, most of the time. The same method can be applied to any other flash operation like read and erase.

The maximum number of active memory arrays can be flexibly changed/programmed by the host to define the ratio between write performance and electrical current level. Some hosts could implement this by enabling standard-defined power management features and defining a level of compromise between power consumption and performance. However, some host systems may prefer slow memory devices with low electrical current levels, and in some cases even the same host system may prefer different combination of performance and power consumption in different operating modes. Each of these arrangements can be catered for using the method described above.

Various modifications may be made to the arrangements as hereinbefore described without departing from the scope of the invention. For example, a system which incorporates a flash disk device may be physically partitioned in several ways, according to the system architecture, however, all systems generally conform to the structure described herein before. For example the flash memory 20 is shown in FIG. 2 as being part of a memory system 10, however, it may alternatively be on a removable card and may connect to a host system via a logical interface 14 which as before conforms to industry standard protocols. Examples of such industry standards being PCMCIA ATA, Compact Flash and MultiMediaCard. In such an arrangement the controller may be on a removable card in which case the controller is typically a single integrated circuit. The Flash memory 10 may consist of one or more integrated circuits and the controller may be integrated on the same integrated circuit as the Flash memory.

Figure 12:
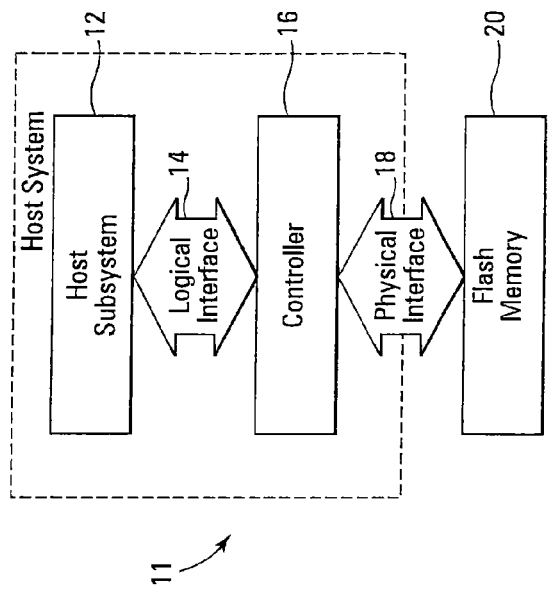
FIG. 12 shows an alternative memory system arrangement in accordance with another embodiment of the present invention.

It could also be the case that the host and the flash system may be physically partitioned such that only the Flash memory is on a removable card, which has a physical interface to the host system. A hierarchy of this arrangement is shown in FIG. 12. An example of such a removable Flash memory card is SmartMedia. The controller is located within the host system 11 and may take to form of an integrated circuit, or of firmware which is executed by a processor within the host system.

Alternatively the method of the present invention may be implemented in an embedded memory system which is not physically removable from a host system. Such a system may have the same partitioning as is used for a memory system on a removable card, with the controller being in the form of an integrated circuit and with a logical interface conforming to industry standard protocols. However, the controller may also be integrated with other functions within the host system.

In the arrangement described, each sector is identified by a LBA, however, it may also be identified by an address in the Cylinder/Head/Sector (CHS) format originally used with magnetic disk devices. Also in the described arrangement the controller hardware is dedicated architecture in a separate integrated circuit, however, elements of the controller hardware, such as the microprocessor, may be shared with other functions within the host system. Additionally the cyclic storage management algorithm may be implemented in a microprocessor within the host system or the process may be performed via standard microprocessor input/output ports without any dedicated controller hardware. If the controller is part of an embedded memory system and shares its microprocessor with other functions of a host system, the logical interface for the control of the memory system may be implemented directly within firmware executed by the processor, this means that hardware registers may be eliminated and variables may be passed directly to a controller function which may be called a host function within the firmware code.

In the flash memory system described previously, data transfer between the host or flash interfaces and the SRAM are performed by DMA however in an alternative embodiment a separate memory block could be used exclusively for buffering sector data. Typically this memory block could be a dual port RAM, with ports allocated independent access by the host interface control block and the flash interface control block.

In the described arrangement the memory blocks into which the memory sectors were arranged were described as being a physical structure within the flash memory comprising 16 sector locations, however it is also possible that these memory blocks comprise 32 flash locations. Also the memory blocks can alternatively be virtual blocks comprising physical blocks distributed across multiple flash chips or multiple independent arrays within the same chip which are erased in a single operation by the controller. Where a virtual block comprises M physical blocks, each with capacity for N sector, the virtual block has capacity for M*N sectors. A virtual block is treated in exactly the same way as a physical block by the cyclic storage media management algorithms.

It should also be noted that the ROM and expansion port of the controller of the memory system are optional features and need not be included.

Furthermore, each array in the flash memory is described previously as being a complete flash chip, however, it is also the case that each array may be a constituent part of a chip, as some Flash chips such as some 512 Mbit NAND flash designs incorporate multiple arrays within a chip and separate sector program operations may be independently started in different arrays within the chip. Also in the description, pages within the flash array have been described as being equivalent to a sector, however in some AND flash memory chips a page may comprise four sectors and have a capacity of 2112 bytes, in each case the page is programmed in a single operation. Additionally each group of sector data has been described as being the first four sector data of a file, however it may alternatively be a file fragment. Also the host system can write data to the memory system in units of a cluster wherein each cluster will be treated as the controller as an integral number of groups, as opposed to the data being written to the memory system as single sectors.

Although the present invention has been described in terms of specific embodiments it is anticipated that alterations and modifications thereof will no doubt become apparent to those skilled in the art. It is therefore intended that the following claims be interpreted as covering all such alterations and modification as fall within the true spirit and scope of the invention.

What is claimed is:
1. A method of operating a memory system, comprising:
  initiating an operation for access of two or more groups of memory cells;
  checking a current status of each of the two or more groups of memory cells during the operation;
  determining a number of the two or more groups of memory cells that are simultaneously active during the operation;
  delaying the operation if the number of the two or more groups of memory cells that are simultaneously active during the operation is at a particular value; and continuing with the operation if the number of the two or more groups of memory cells that are simultaneously active during the operation is below the particular value.

2. The method of claim 1, further comprising:
initiating a second operation for access of the two or more groups of memory cells;
checking a current status of each of the two or more groups of memory cells during the second operation;
determining a number of the two or more groups of memory cells that are simultaneously active during the second operation;
delaying the operation if the number of the two or more groups of memory cells that are simultaneously active during the second operation is at a second particular value; and
continuing with the second operation if the number of the two or more groups of memory cells that are simultaneously active during the second operation is below the second particular value;
wherein the second operation is different than the operation;
wherein the second particular value is different than the particular value; and
wherein the operation and the second operation are selected from the group consisting of a read operation, a transfer operation, a programming operation, and an erase operation.

3. The method of claim 1, further comprising delaying the operation even though the memory system is capable of concurrent access of a number of groups of memory cells in excess of the particular value.

4. The method of claim 1, wherein initiating an operation for access of two or more groups of memory cells comprises initiating an operation for access of two or more memory arrays.

5. The method of claim 1, wherein initiating an operation for access of two or more groups of memory cells comprises initiating an operation for access of two or more memory chips.

6. The method of claim 1, wherein continuing with the operation if the number of the two or more groups of memory cells that are simultaneously active during the operation is below the particular value comprises accessing a next group of memory cells while accessing a previous group of memory cells.

7. The method of claim 1, further comprising: adjusting the particular value in response to electrical parameters for the operation.

8. The method of claim 7, wherein adjusting the particular value in response to electrical parameters for the operation comprises adjusting the particular value to maintain an electrical current level of the memory system below a particular value during the operation.

9. The method of claim 7, wherein adjusting the particular value in response to electrical parameters for the operation comprises adjusting the particular value to maintain a particular ratio between performance and power consumption.

10. The method of claim 1, wherein initiating an operation for access of two or more groups of memory cells comprises initiating an operation for access of two or more groups of memory cells wherein only one access can be performed at any one time in each of the two or more groups of memory cells.

11. A method of operating a memory system, comprising:
initiating a sequential access of two or more groups of memory cells;
determining an electrical current level of the accessed groups of memory cells;
delaying access of one of the groups of memory cells if a next access in the sequence would exceed a particular value of the electrical current level; and
continuing with the sequential access when the next access in the sequence would produce an electrical current level below the particular value.

12. The method of claim 11, wherein initiating a sequential access of two or more groups of memory cells comprises:
initiating transfer of first data for a first group of memory cells;
initiating programming of the first data to the first group of memory cells;
initiating transfer of second data for a second group of memory cells while programming the first data to the first group of memory cells; and
initiating programming of the second data to the second group of memory cells while programming the first data to the first group of memory cells.

13. The method of claim 12, wherein initiating a sequential access of two or more groups of memory cells further comprises:
initiating transfer of third data for a third group of memory cells while programming the first data to the first group of memory cells and while programming the second data to the second group of memory cells; and
initiating programming of the third data to the third group of memory cells while programming the first data to the first group of memory cells and while programming the second data to the second group of memory cells.

14. The method of claim 12, wherein initiating a sequential access of two or more groups of memory cells further comprises:
initiating transfer of third data for a third group of memory cells while programming the second data to the second group of memory cells and after completion of programming the first data to the first group of memory cells; and
initiating programming of the third data to the third group of memory cells while programming the second data to the second group of memory cells.

15. A method of operating a memory system, comprising:
initiating a sequential access of two or more groups of memory cells;
determining a number of the two or more groups of memory cells that are simultaneously active during the sequential access;
delaying access of a next group of memory cells in the sequence if the number of the two or more groups of memory cells that are simultaneously active during the sequential access is at a particular value; and
accessing the next group of memory cells in the sequence when the number of the two or more groups of memory cells that are simultaneously active during the sequential access is below the particular value.

16. The method of claim 15, wherein initiating a sequential access of two or more groups of memory cells comprises:
initiating transfer of first data for a first group of memory cells;
initiating programming of the first data to the first group of memory cells;
initiating transfer of second data for a second group of memory cells while programming the first data to the first group of memory cells; and initiating programming of the second data to the second group of memory cells while programming the first data to the first group of memory cells.

17. The method of claim 16, wherein delaying access of a next group of memory cells in the sequence comprises:
delaying transfer of third data for a third group of memory cells until programming of the first data to the first group of memory cells is completed, if the particular value is two.

18. The method of claim 15, wherein accessing the next group of memory cells in the sequence when the number of the two or more groups of memory cells that are simultaneously active during the sequential access is below the particular value comprises accessing the next group of memory cells while continuing to access a previous group of memory cells.

19. The method of claim 15, further comprising delaying access of the next group of memory cells in the sequence even though the memory system is capable of accessing the next group of memory cells.

20. The method of claim 15, further comprising adjusting the particular value in response to a type of access being performed.

* * * * *